(12) United States Patent
Ariesen et al.

(10) Patent No.: US 12,425,540 B2
(45) Date of Patent: Sep. 23, 2025

(54) FIBER-COAXIAL AMPLIFIER DEVICE

(71) Applicant: TECHNETIX B.V., Veenendaal (NL)

(72) Inventors: Jan Ariesen, Veenendaal (NL);
Martien Rijssemus, Veenendaal (NL);
Matthijs Laro, Veenendaal (NL);
Premton Bogaj, Veenendaal (NL)

(73) Assignee: TECHNETIX B.V., Veenendaal (NL)

( * ) Notice: Subject to any disclaimer, the term of this patent is extended or adjusted under 35 U.S.C. 154(b) by 719 days.

(21) Appl. No.: 17/750,522

(22) Filed: May 23, 2022

(65) Prior Publication Data

US 2023/0043736 A1    Feb. 9, 2023

(30) Foreign Application Priority Data

Aug. 6, 2021   (GB) .................................... 2111357

(51) Int. Cl.
*H04N 7/10* (2006.01)
(52) U.S. Cl.
CPC .................................. *H04N 7/102* (2013.01)
(58) Field of Classification Search
CPC ..................................................... H04N 7/102
See application file for complete search history.

(56) References Cited

U.S. PATENT DOCUMENTS

| 5,898,899 | A  | * | 4/1999  | Ellis    | H04N 7/102    |
|           |    |   |         |          | 348/192       |
| 6,820,196 | B2 | * | 11/2004 | Kessler  | H04N 21/8166  |
|           |    |   |         |          | 713/1         |
| 6,915,530 | B1 | * | 7/2005  | Kauffman | H04N 7/102    |
|           |    |   |         |          | 455/295       |
| 8,175,298 | B2 | * | 5/2012  | Mitani   | H04N 5/60     |
|           |    |   |         |          | 381/74        |
| 8,201,211 | B2 | * | 6/2012  | Proust   | G06F 21/575   |
|           |    |   |         |          | 707/999.203   |
| 8,351,624 | B2 | * | 1/2013  | Motomura | H04N 21/43635 |
|           |    |   |         |          | 348/706       |
| 8,838,911 | B1 | * | 9/2014  | Hubin    | G11B 20/10527 |
|           |    |   |         |          | 711/147       |
| 2003/0193369 | A1 |   | 10/2003 | Jackson et al. | |

(Continued)

FOREIGN PATENT DOCUMENTS

| WO | 0005823 A1    | 2/2000 |
| WO | 2020002749 A1 | 1/2020 |

OTHER PUBLICATIONS

Brian Berscheid et al., "Full duplex DOCSIS: opportunities and challenges" IEEE Communication Magazine, vol. 57, 2019, pp. 28-33 (Aug. 2019).

*Primary Examiner* — Michael B. Pierorazio
(74) *Attorney, Agent, or Firm* — SZDC Law PC

(57) ABSTRACT

There is provided fiber-coaxial amplifier device (10) comprising at least one output (14) and a test point (26) associated with the at least one output (14), wherein alternative first and second electrical paths (36, 38) are connectable to the at least one output (14), the first path (36) connectable to the at least one output (14) whilst bypassing the test point, the second path (38) connectable to both the at least one output (14) and the test point (26), and a relay (30) operable to connect one of the first path or the second path to the at least one output (14). The fiber-coaxial amplifier device (10) is configured for signals complying with Extended Spectrum DOCSIS.

10 Claims, 1 Drawing Sheet

(56) References Cited

U.S. PATENT DOCUMENTS

Figure 1:
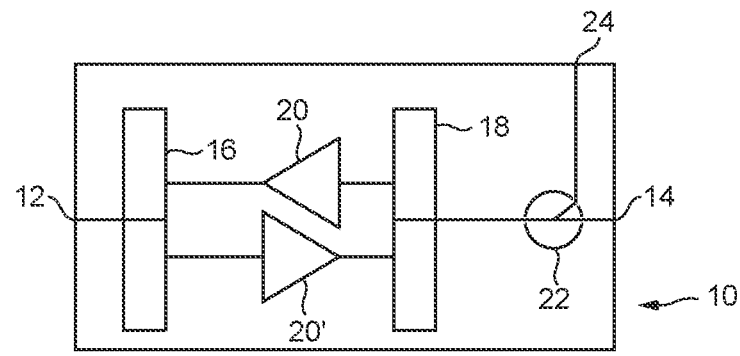

| Publication No. | Date | Name | Classification |
|---|---|---|---|
| 2006/0161958 A1* | 7/2006 | Choung | H04N 21/4122 725/78 |
| 2007/0046835 A1* | 3/2007 | Kim | H04N 21/42204 348/731 |
| 2008/0063216 A1* | 3/2008 | Sakata | H04S 3/008 381/80 |
| 2008/0309830 A1* | 12/2008 | Motomura | H04N 21/43635 348/E5.122 |
| 2008/0320545 A1* | 12/2008 | Schwartz | H04N 7/17318 725/135 |
| 2010/0315553 A1* | 12/2010 | Takatsuji | G06F 21/10 348/E9.034 |
| 2010/0321479 A1* | 12/2010 | Yang | H04N 21/816 348/51 |
| 2011/0051002 A1* | 3/2011 | Oh | H04N 5/765 348/569 |
| 2011/0068736 A1* | 3/2011 | Chartier | H02J 7/00 320/137 |
| 2011/0113442 A1* | 5/2011 | Kikkawa | G09G 5/006 725/25 |
| 2011/0134338 A1* | 6/2011 | Toba | H04N 5/765 348/734 |
| 2011/0142245 A1* | 6/2011 | Toba | G11B 20/10527 381/22 |
| 2011/0176057 A1* | 7/2011 | Okamura | H04N 21/439 348/554 |
| 2011/0234916 A1* | 9/2011 | Fujita | H04N 5/60 348/E5.122 |
| 2012/0002562 A1* | 1/2012 | Kawade | H04N 5/765 370/252 |
| 2012/0030728 A1* | 2/2012 | Yukawa | G06F 9/44 725/151 |
| 2012/0042346 A1* | 2/2012 | Yoshida | H04N 21/4363 725/81 |
| 2012/0045220 A1* | 2/2012 | Veljkovic | H04N 7/102 398/186 |
| 2012/0136612 A1* | 5/2012 | Vanderhoff | H04N 17/004 702/119 |
| 2012/0188456 A1* | 7/2012 | Kuroyanagi | H04N 5/765 348/731 |
| 2012/0307157 A1* | 12/2012 | Utsunomiya | H04N 21/43622 348/707 |
| 2013/0021536 A1* | 1/2013 | Kamida | H04N 21/43622 348/739 |
| 2013/0051578 A1* | 2/2013 | Chu | H04B 1/123 381/94.1 |
| 2013/0051584 A1* | 2/2013 | Higuchi | H04N 21/8106 381/123 |
| 2013/0223538 A1* | 8/2013 | Wang | H04N 21/43637 375/E7.027 |
| 2013/0292311 A1* | 11/2013 | Shaw | E03F 5/042 137/15.01 |
| 2014/0193134 A1* | 7/2014 | Maeda | H04N 21/43072 386/231 |
| 2015/0077633 A1* | 3/2015 | Lee | H04N 21/4392 348/515 |
| 2017/0146579 A1* | 5/2017 | Beaty | H05F 3/04 |
| 2021/0036666 A1* | 2/2021 | Krivokapic | H03F 3/72 |

* cited by examiner

FIBER-COAXIAL AMPLIFIER DEVICE

This application claims priority to United Kingdom Patent Application No. GB 2111357.6, filed on Aug. 6, 2021, which is incorporated by reference for all purposes as if fully set forth herein.

FIELD OF THE INVENTION

This invention relates to a fiber-coaxial amplifier device, and in particular such a device intended for use with Extended Spectrum DOCSIS.

BACKGROUND TO THE INVENTION

In amplifier devices, and in particular hybrid fiber-coaxial amplifier devices, one or more test points are provided where technicians can measure signal properties and if necessary modify those signals. Hybrid fiber-coaxial amplifiers have a test point associated with an output port. As amplifiers are re-configured to operate effectively for different signal standards, for example Extended Spectrum DOCSIS (ESD), losses associated with the test point introduce technical limitations which affect the amplifier design.

SUMMARY OF THE INVENTION

In accordance with the present invention, there is provided a fiber-coaxial amplifier device comprising at least one output and a test point associated with the at least one output to enable measurements and modification of electrical signals, wherein alternative first and second electrical paths are connectable to the at least one output, the first path connectable to the at least one output whilst bypassing the test point, the second path connectable to both the at least one output and the test point, and a switching element operable to connect one of the first path or the second path to the at least one output, so as to achieve passage of signals through the amplifier from an input of the amplifier to the output of the amplifier. In such a way, a test point and its associated loss characteristics only affect the network when the second path is connected to enable a technician to test signals at the output.

A coupler connected to the test point and connectable to the at least one output is preferably disposed in the second path.

The switching element is preferably responsive to an actuation signal, such as an electrical signal, infra-red or wireless signal.

The switching element may comprise a relay, preferably an electrical relay and the relay may comprise mechanical parts, for example a mechanical spring so as to improve robustness.

The switching element preferably connects the first path to the at least one output when the switching element is in a rest position.

To ensure connection of the second path is temporary and to ensure loss characteristics associated with the test point only affect the network when the test point is being used by a technician, the switching element may be operable to reinstate the first path after a set time of the second path being active and connected to the output, for example after 1 to 10 minutes.

The device may comprise a plurality of outputs and a plurality of test points, each output associated with a single test point.

The fiber-coaxial amplifier device is preferably configured for signals complying with Extended Spectrum DOCSIS.

The invention will now be described by way of example in relation to the following drawings in which:

FIG. 1 is a schematic diagram of a hybrid fiber-coaxial amplifier; and

FIGS. 2(a) and (b) show schematic diagrams of part of an amplifier in accordance with the present invention.

DESCRIPTION

An illustrative example of a hybrid fiber-coaxial (HFC) amplifier device 10 as used in a broadband and/or cable television (CATV) network is shown in FIG. 1. Amplifier 10 comprises an input 12 and an output 14 with diplex filters 16, 18 to separate upstream and downstream signals for amplification by amplifier elements 20, 20'. Bi-directional passage of upstream and downstream signals occurs through device 10 with the configuration of electronic components and numbers of input and output ports varying depending on the network requirements. Device 10 further comprises coupler 22 disposed in a signal path to output port 14 so as to provide an output test point 24 allowing a technician to measure and modify downstream and upstream signals without disconnecting amplifier device 10 from the network.

For new amplifiers being developed for signals complying with Extended Spectrum DOC SIS (ESD) 1.8 GHz, output test point 24 is still required. However the insertion losses associated with test point 24 can be as much as 2 dB. These insertion losses result in less output power at output 14 and to offset this the power consumption of amplifier 10 has to be doubled.

Test point 24 is only used at certain times in the lifetime of an amplifier. In accordance with the invention and as shown in FIGS. 2(a) and (b), test point 26 is only activated when required, ensuring any losses associated with test point 26 do not affect the output power. To achieve this test point 26 and connected coupler 28 are associated with a relay 30 which in a first state, or rest state, as shown in FIG. 2(a) activates switches 32, 34 to form a signal path 36 to output 14, bypassing test point 26 and coupler 28 which are physically and electrically disconnected from output 14 and from the network. In the rest state, losses attributable to test point 26 and coupler 28 do not contribute to losses of device 10. When testing of a signal is required at test point 26, relay 30 is activated to a second or active state, as shown in FIG. 2(b), with switches 32, 34 making contact with coupler 28 to create an alternative second signal path 38 to which both output 14 and test point 26 are connected, with test point 26 becoming operational.

Figure 2:
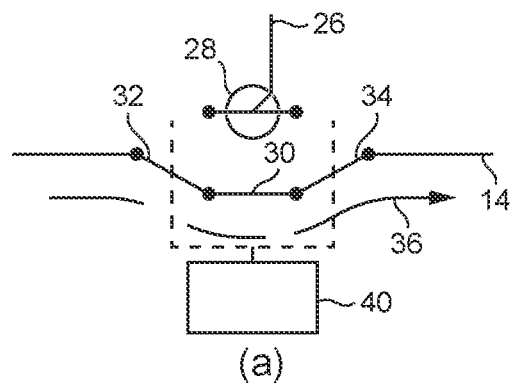
Figure 2:
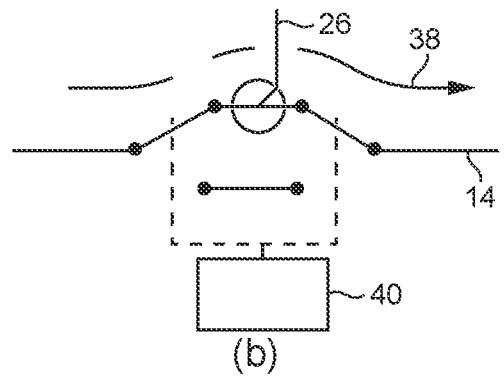

As shown in FIG. 2, control of relay 30 is achieved using microprocessor 40 responsive to an actuation signal from a technician, for example infra-red actuation, a wireless signal, a signal supplied to a USB, or remotely via a transponder or Remote-PHY/MACPHY device. If desired control can be achieved using a mechanical spring arrangement as part of the relay or instead of the relay to improve robustness. A timer can be used in conjunction with relay 30 to ensure the default rest state is restored after a set time, typically between 1 to 10 minutes to ensure a technician has sufficient time to undertake the required tests and signal adjustments.

Relay 30 typically introduces a loss of around 0.2 dB which is a substantial reduction from the 2 dB insertion loss associated with test point 24, 26 and coupler 22, 28. This greatly assists with re-configuring the amplifier to be suitable for ESD as the saving in insertion loss of around 1.8 dB by disconnecting the test point except when needed ensures it is easier to keep the overall losses associated with the amplifier within a suitable range.

The invention claimed is:

1. A fiber-coaxial amplifier device comprising at least one output and a test point associated with the at least one output, wherein alternative first and second electrical paths are connectable to the at least one output, the first path connectable to the at least one output whilst bypassing the test point, the second path connectable to both the at least one output and the test point, and a switching element operable to connect one of the first path or the second path to the at least one output; and wherein the fiber-coaxial amplifier device is a hybrid fiber-coaxial (HFC) amplifier device.

2. A fiber-coaxial amplifier device according to claim 1, wherein a coupler is disposed in the second path and the coupler is connected to the test point and is connectable to the at least one output.

3. A fiber-coaxial amplifier device according to claim 1, wherein the switching element is responsive to an actuation signal.

4. A fiber-coaxial amplifier device according to claim 1, wherein the switching element comprises a relay.

5. A fiber-coaxial amplifier device according to claim 4, wherein the relay is an electrical relay.

6. A fiber-coaxial amplifier device according to claim 4, wherein the relay comprises a mechanical spring.

7. A fiber-coaxial amplifier device according to claim 1, wherein the switching element connects the first path to the at least one output when the switching element is in a rest position.

8. A fiber-coaxial amplifier device according to claim 1, wherein the switching element is operable to reinstate the first path after a set time of the second path being connected to the output.

9. A fiber-coaxial amplifier device according to claim 1, further comprising a plurality of outputs and a plurality of test points, each output associated with a single test point.

10. A fiber-coaxial amplifier device according to claim 1 when configured for signals complying with Extended Spectrum DOCSIS.

* * * * *